United States Patent [19]

Bosselaers

[11] 4,399,413

[45] Aug. 16, 1983

[54] HIGH SPEED SAMPLING HEAD

[75] Inventor: Robert J. Bosselaers, Winchester, Mass.

[73] Assignee: RCA Corporation, New York, N.Y.

[21] Appl. No.: 233,194

[22] Filed: Feb. 10, 1981

[51] Int. Cl.³ ..................... H03K 5/00; H03K 17/00; H03K 17/74; H03K 17/58

[52] U.S. Cl. .................................. 328/151; 307/256; 307/317 A; 307/352

[58] Field of Search ............... 328/151; 307/352, 321, 307/257, 523

[56] References Cited

U.S. PATENT DOCUMENTS

| | | | |
|---|---|---|---|
| 3,584,920 | 6/1971 | Sills | 307/257 |
| 3,760,283 | 9/1973 | Lockwood | 328/151 |
| 3,914,626 | 10/1975 | Peterson | 307/352 |
| 4,068,135 | 1/1978 | Sonobe | 307/352 |

Primary Examiner—John S. Heyman
Assistant Examiner—Timothy P. Callahan
Attorney, Agent, or Firm—Joseph S. Tripoli; C. L. Maginniss

[57] ABSTRACT

A high-speed sampling head is disclosed which provides a transformer to isolate the sampling pulse source from the RF signal line to be sampled. The pulse width limitation of the transformer is overcome by propagating balanced forms of the pulse along a length of transmission line which enable unbalanced components of the sampled waveform to be propagated back along the transmission line, where the unbalanced components are detected and measured. The trailing edge of the sampling pulse passing through the transformer terminates the signal detection.

9 Claims, 3 Drawing Figures

PRIOR ART Fig. 1

HIGH SPEED SAMPLING HEAD

This invention relates to a sampling head and more particularly to an apparatus for providing a narrow pulse for sampling the instantaneous amplitude of the signal on a radio frequency (RF) line without loading down the line.

Sampling is the process of obtaining a sequence of instantaneous values of a wave, at regular or intermittent intervals. A sampling circuit is one whose output is a series of discrete values representative of the values of an input wave at a series of points in time. A sampling circuit includes means for measuring the instantaneous value of the input signal, means for storing the values measured, and processing means for making decisions based on those values. Sampling circuits find application in the storage of analog data in a digital medium, in the transmission of an analog signal via a digital communications link, and in equipment used for testing analog circuitry to ensure responses within predetermined bounds.

The present invention deals with the front-end circuitry—the sampling head which provides an output signal response representative of the input signal level at a particular instant in time. It is an obvious objective of a sampling circuit that its output values should be true representations of the input waveshape. This objective lends itself to the following design goals for the sampling head: (a) the sampling interval must be sufficiently short that the sampled input waveform assumes a relatively constant value during the interval; (b) the sampling rate, the frequency with which samples are taken, must be sufficiently high to ensure that the input waveshape has been faithfully reproduced; and (c) the dynamic range of the sampling circuit must be sufficient to detect all values which the input wave may assume. In addition, it is a requirement that the sampling head not load down the signal line conducting the input signal so as to affect the input signal waveform, either by its attachment to the signal line or merely during the sampling interval. The present invention is incorporated within a circuit for infrequent sampling of radio frequency (RF) signals on a transmission line, so the design goals of short sampling intervals and constant loading of the RF line are especially critical.

The circuit shown in FIG. 1 as prior art is typical of sampling heads which generate symmetrical pulses to overcome the reverse bias applied to diodes coupled directly to the RF signal line. Once the bias has been overcome, i.e., the diodes begin to conduct, the RF signal is conducted through the diodes and appears at the output terminal. A disadvantage of this type of arrangement is that the RF line is loaded by the pulse source during the sampling interval, while the diodes are conducting. This not only reduces the sampling efficiency, but also limits the useful dynamic range to the voltage drops across the two diodes, which is approximately one volt peak-to-peak. Improvement in the dynamic operating range of this prior art circuit can be obtained by isolating the RF line from the pulse source. One method for providing this isolation involves coupling the pulse source to the primary winding of a transformer having a balanced secondary winding coupled to the reverse-biased diodes. However, by using a transformer, in the manner described, the narrowest sampling pulse width which can be obtained is limited by the impulse response of the transformer.

The sampling head of the present invention employs transformer isolation between the pulse source and the RF line, but it additionally uses four diodes, two on each end of a balanced line, arranged in such a way as to provide a sampling pulse which is shorter than the pulse which passes through the transformer. This arrangement causes the transformer output pulse wave to propagate down the balanced line and the RF signal wave to propagate back along the balanced line such that sampling does not begin until the second excursion on the balanced line is complete, and ends with the trailing edge of the pulse passing through the transformer. The sampling head of the present invention provides the advantages of improved efficiency by floating the pulse drive, an increased dynamic range which is set by the reverse-bias applied to the diodes, and a reasonably wide bandwidth as a result of the pulse-shortening technique.

In accordance with one embodiment of the present invention an apparatus is disclosed for sampling the instantaneous level of an RF signal conducted by a transmission line. A pulse of predetermined width is generated by a pulse source, which is coupled to a means for transforming the pulse into balanced signals. A pair of conductors is coupled at one end to the transforming means for conducting the balanced signals along its length at a predetermined velocity. Coupled between the other ends of the pair of conductors and the transmission line conducting the RF signal is a means for isolating the RF signal from the pair of conductors in the absence of the balanced signals, and for applying the RF signal to the pair of conductors in the presence of the balanced signals. A sensing circuit coupled to the transforming means measures the amplitude of the RF signal applied to the pair of conductors. Finally, means are provided for blocking the RF signal from the sensing circuit in the absence of the pulse.

Figure 1:
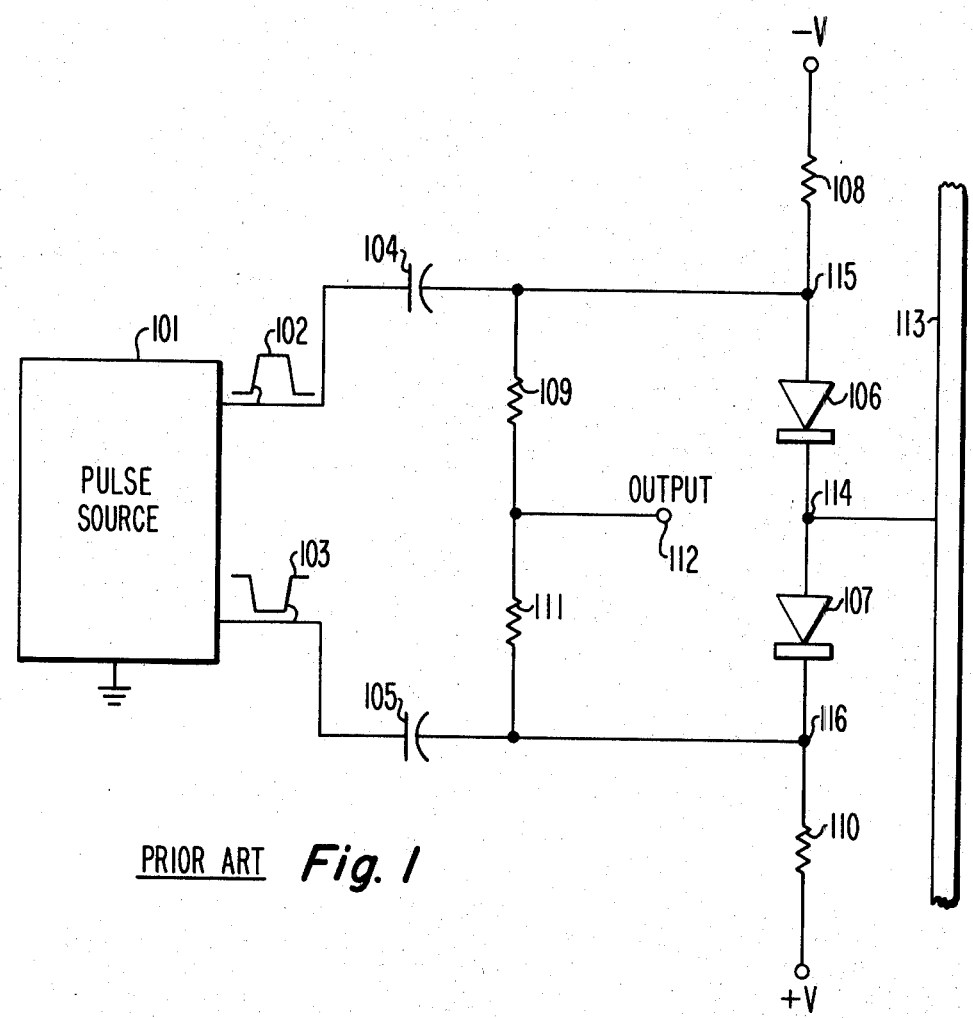
FIG. 1 is a circuit diagram of a sampling head according to the prior art.

FIG. 1 represents a typical sampling head circuit according to the prior art. Symmetrical pulse source 101 is coupled between capacitors 104 and 105 and ground. Pulse source 101 applies a short positive pulse 102 through coupling capacitor 104 to the anode of diode 106 which is reverse biased by a voltage determined by $$-V \cdot \frac{\text{Resistor 109}}{\text{Resistor 108} + \text{Resistor 109}}.$$

Capacitor 104 blocks the dc bias from pulse source 101. The short positive pulse 102 overcomes the reverse bias at node 115 causing conduction through diode 106 for the duration of the pulse.

Similarly, pulse source 101 applies a short negative pulse 103 through coupling capacitor 105 to the cathode of diode 107 which is reverse biased by a voltage determined by $$V \cdot \frac{\text{Resistor 111}}{\text{Resistor 110} + \text{Resistor 111}}.$$

Capacitor 105 blocks the dc bias from pulse source 101. Resistors 108 and 110 are typically equal, as are resistors 109 and 111, resulting in equal but opposite bias voltages at nodes 115 and 116. The short negative pulse 103 overcomes the reverse bias at node 116 causing conduction through diode 107 for the duration of the pulse. Because of the symmetrical nature of the circuit elements, the bias voltages, and the pulse source, the voltage at output terminal 112 is zero in response to the application of the bias voltages and the pulses.

Node 114, common to the two diodes 106 and 107, tracks the instantaneous voltage level of the RF signal on transmission line 113. As long as diodes 106 and 107 remain reverse-biased, the shifting voltage level at node 114 is undetectable at output terminal 112. But when pulses 102 and 103 occur, current flows through diodes 106 and 107 resulting in a voltage across nodes 115 and 116 of two diode voltage drops (about one volt), and during this current flow the voltage level at node 114 causes a corresponding voltage shift at nodes 115 and 116. The voltage shift appears at output node 112 as the RF signal sample, and ends with the termination of pulses 102 and 103.

One disadvantage of this type of arrangement is the loading of the RF line 113 by the pulse source 101 during the period of conduction. This not only reduces the sampling efficiency, but also limits the useful dynamic voltage range of the circuit from a high of one diode drop above ground to a low of one diode drop below ground, a range of approximately one volt peak-to-peak. The dynamic operating range of this circuit can be extended if the pulse source is isolated from the diodes by means such as a balanced transformer. Using this method, however, the narrowest pulse width which can be obtained is limited by the impulse response of the transformer, imposing a sampling frequency limitation on the circuit.

Figure 2:
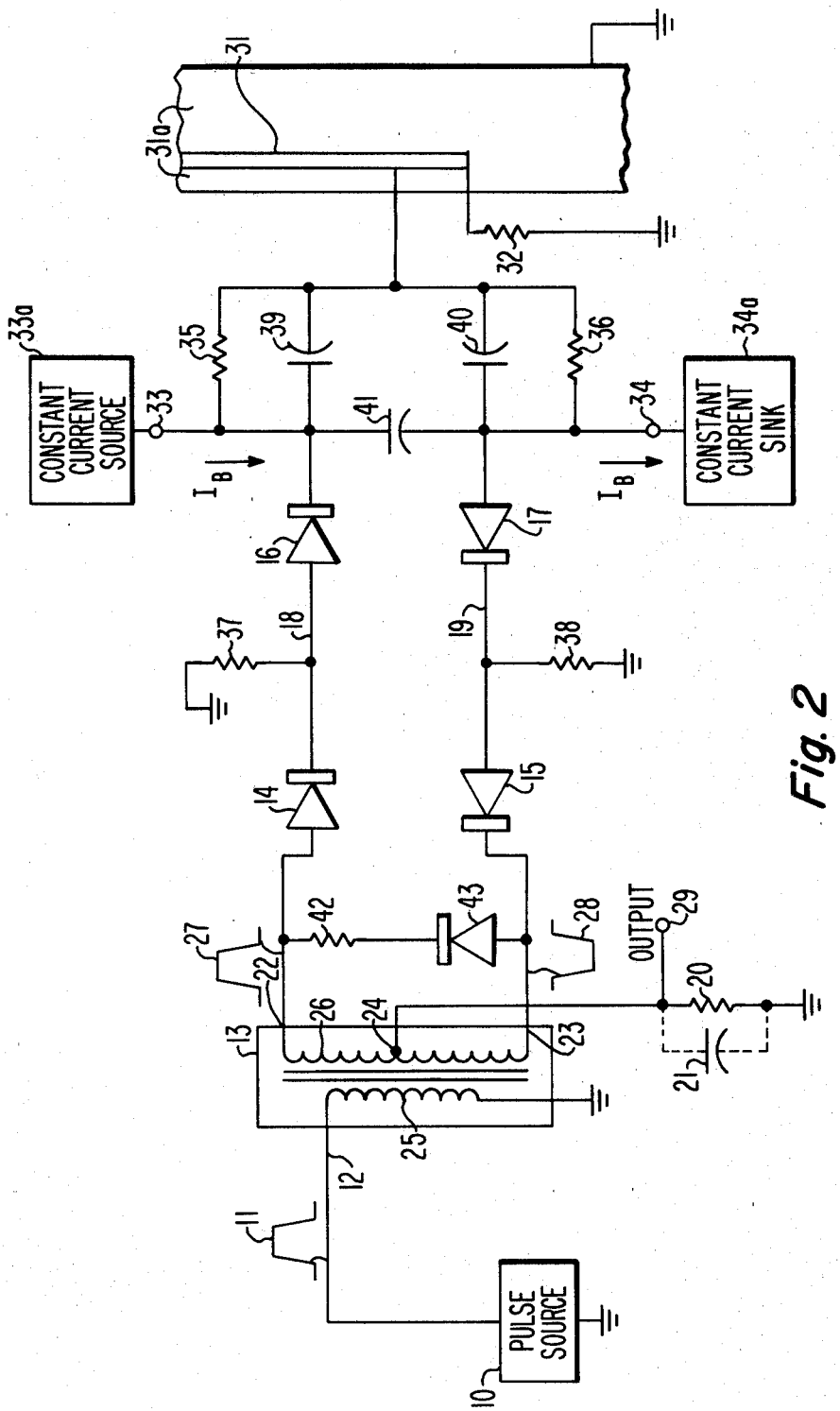
FIG. 2 is a circuit diagram of the preferred embodiment of the present invention.

The present invention, shown in its preferred embodiment in FIG. 2, is a sampling head circuit including a balanced transformer providing isolation between the sampling pulses and the RF signal line. In addition, the circuit provides means for shortening the effective width of the sampling pulse so as to increase the frequency range of the circuit.

Referring to FIG. 2, a pulse 11 is generated by pulse source 10 and conducted via lead 12 to the primary winding 25 of transformer 13. Pulse source 10 is a circuit well known in the art and may employ, for example, an avalanche transistor or a step-recovery diode to generate its pulse outputs. Pulse 11 has been depicted in FIG. 2 as a positive pulse, but it will be obvious from the symmetrical nature of the circuit that a negative pulse would be equally applicable. Transformer 13 is of the type having a center-tapped secondary winding 26 whereby the signals at the two extremes 22 and 23 of the winding are balanced (equal in amplitude and opposite in polarity) with reference to the signal at the center-tap 24. The center-tap 24 is connected via resistor 20 to ground, thereby providing a signal ground reference for the balanced signals on the secondary winding 26.

A positive pulse 27, appearing at terminal 22 of transformer 13 in response to pulse 11 at the primary winding 25, is applied to the anode of diode 14 causing it to conduct. A negative pulse 28, equal in amplitude to pulse 27, appearing at terminal 23 of transformer 13 in response to the same pulse 11, is simultaneously applied to the cathode of diode 15 causing it to conduct. Diodes 14 and 15 are, for the example, type HP5082-2815 Schottky barrier diodes, sold by Hewlett-Packard Co., Palo Alto, California. The cathode of diode 14 and the anode of diode 15 are connected respectively to conductors 18 and 19 which comprise a balanced transmission line. The other ends of the conductors 18 and 19 are coupled respectively to the anode of diode 16 and the cathode of diode 17. Diodes 16 and 17 are similar to the type used for diodes 14 and 15. It is desirable that diodes 14, 15, 16 and 17 be matched quads but, failing this, the diode pairs 14–15 and 16–17 should at least be matched pairs.

The RF signal to be sampled appears on conductor 31, which, in the example, is one conductor of a strip transmission line. The other conductor 31a is a plane of conductive material on the opposite side of the circuit board and is connected to ground. The RF signal is impressed across resistor 32 which matches the characteristic impedance of the transmission line, which, in the example, is 50 ohms.

A constant current source 33a and a constant current sink 34a are coupled through terminals 33 and 34 respectively, which provide a dc current flow of $I_B$ through resistors 35 and 36. Although the exact nature of the current source and sink is unimportant, they may be provided as the outputs of transistors of complementary conductivity types, which have equal control currents and equal but opposite input voltages. As a result of the constant current flow, constant voltage drops are developed across resistors 35 and 36, and bias voltages are maintained at the cathode of diode 16 and anode of diode 17. Typically, resistors 35 and 36 are equal and so long as the peak-to-peak voltage of the RF signal does not exceed the sum of the voltage drops across resistors 35 and 36, diodes 16 and 17 will be held reverse-biased.

The positive and negative pulses 27 and 28 applied to diodes 14 and 15, respectively, are transmitted along conductors 18 and 19, respectively. Conductors 18 and 19 together comprise a balanced transmission line, a pair of parallel wires of equal length that possess a uniform characteristic impedance. The other ends of conductors 18 and 19 are connected to the anode of diode 16 and cathode of diode 17, respectively. Resistors 37 and 38, connected to the approximate mid-points of conductors 18 and 19, respectively, are of high impedance and are employed to drain residual charge from the conductors 18 and 19 when diodes 14, 15, 16 and 17 are non-conducting. By virtue of their high impedance, relative to the characteristic impedance of the transmission line comprising conductors 18 and 19, resistors 37 and 38 have substantially no effect on the signals applied to conductors 18 and 19 during pulse operation.

The circuit comprising capacitor 41 in parallel with the series combination of capacitors 39 and 40 might best be thought of as a floating battery, wherein the junction of capacitors 39 and 40, the point at which the RF signal is applied, serves as the input for shifting the reference of the floating battery. A constant dc voltage equal to $$I_B \cdot (\text{Resistor } 35 + \text{Resistor } 36)$$

is maintained across capacitor 41. Capacitors 39 and 40 are effectively short circuits to the RF signal across resistor 32 during conduction of diodes 16 and 17, while at the same time maintaining the reverse dc bias. Although the signal path provided by capacitor 41 is not absolutely necessary to the operation of the circuit, it is good design practice to provide a direct path in the loop between the cathode of diode 16 and the anode of diode 17 in the high frequency domain for which this circuit was intended.

Measuring resistor 20 is connected between ground and the center-tap 24 of the secondary winding 26 of transformer 13, and it provides, at output terminal 29, a measure of the instantaneous amplitude of the RF signal on conductor 31. Capacitor 21, shown in dashed lines in FIG. 2 as connected between output 29 and ground, is the total parasitic capacitance of the secondary winding 26 of transformer 13, resistor 20, and the associated leads. This parasitic capacitance 21 charges in response to the voltage applied at output terminal 29, and maintains the charge for a relatively long period of time following the termination of pulse operation.

Pulses 27 and 28 applied respectively to conductors 18 and 19 are equal in amplitude but opposite in polarity and as such sum to zero volts at center-tap 24. However, the RF signal which returns along conductors 18 and 19 is applied equally to each conductor. Therefore, the RF components of the signals in the secondary winding 26 sum to a non-zero voltage at output terminal 29, while the pulse components cancel out. Resistor 42 and diode 43 connected in series across the secondary winding 26 of transformer 13 and polarized to oppose current flow while pulses 27 and 28 are present, provide a path for dissipating the energy stored in the magnetic field of transformer 13 after pulse 11 has been turned off.

In the operation of the circuit shown in FIG. 2, pulses 27 and 28 cause diodes 14 and 15 to conduct. The pulses propagate along conductors 18 and 19 at a velocity which is determined by the transmission line characteristics. When the leading edges of the pulses reach diodes 16 and 17, their voltage levels overcome the reverse-bias dc voltage on diodes 16 and 17, forcing them into conduction. At this instant, the voltage levels at the cathode of diode 16 and the anode of diode 17 are, respectively, the positive and negative dc bias levels, both shifted by the instantaneous voltage level of the RF signal. As a result, when diodes 16 and 17 begin to conduct, two new wavefronts, the shifted bias voltage levels, begin to propagate back along conductors 18 and 19 at the same velocity as the first propagation. The return wavefronts combine at the center-tap 24 where they begin to charge parasitic capacitor 21.

When pulse 11 terminates, causing pulses 27 and 28 to similarly terminate, diodes 14 and 15 stop conducting the RF signal, and the charging of capacitor 21 ceases. Thus it can be seen that a shortened effective sampling pulse width has been achieved by the use of the balanced line conductors 18 and 19 and the diodes 14 through 17. The period of sampling has been reduced by the time for the propagation of pulses 27 and 28 in one direction along the balanced line, and the time for the propagation of the RF signal back in the other direction. Once the pulses terminate, and parasitic capacitor 21 is no longer being charged, the stored charge is slowly dissipated through resistor 20.

In summary, although pulse 11 may be relatively long, the sampling period of the RF signal does not begin until two wavefront propagations along conductors 18 and 19, and the sampling period ends concurrently with the trailing edge of pulse 11. Expressed in mathematical terms, the period of sampling of the RF signal is the width of pulse 11 less twice the propagation time along conductors 18 and 19. Hence, if the propagation time of conductors 18 and 19 can be selected as slightly less than one-half the width of pulse 11, an extremely short sampling pulse can be generated.

Figure 3:
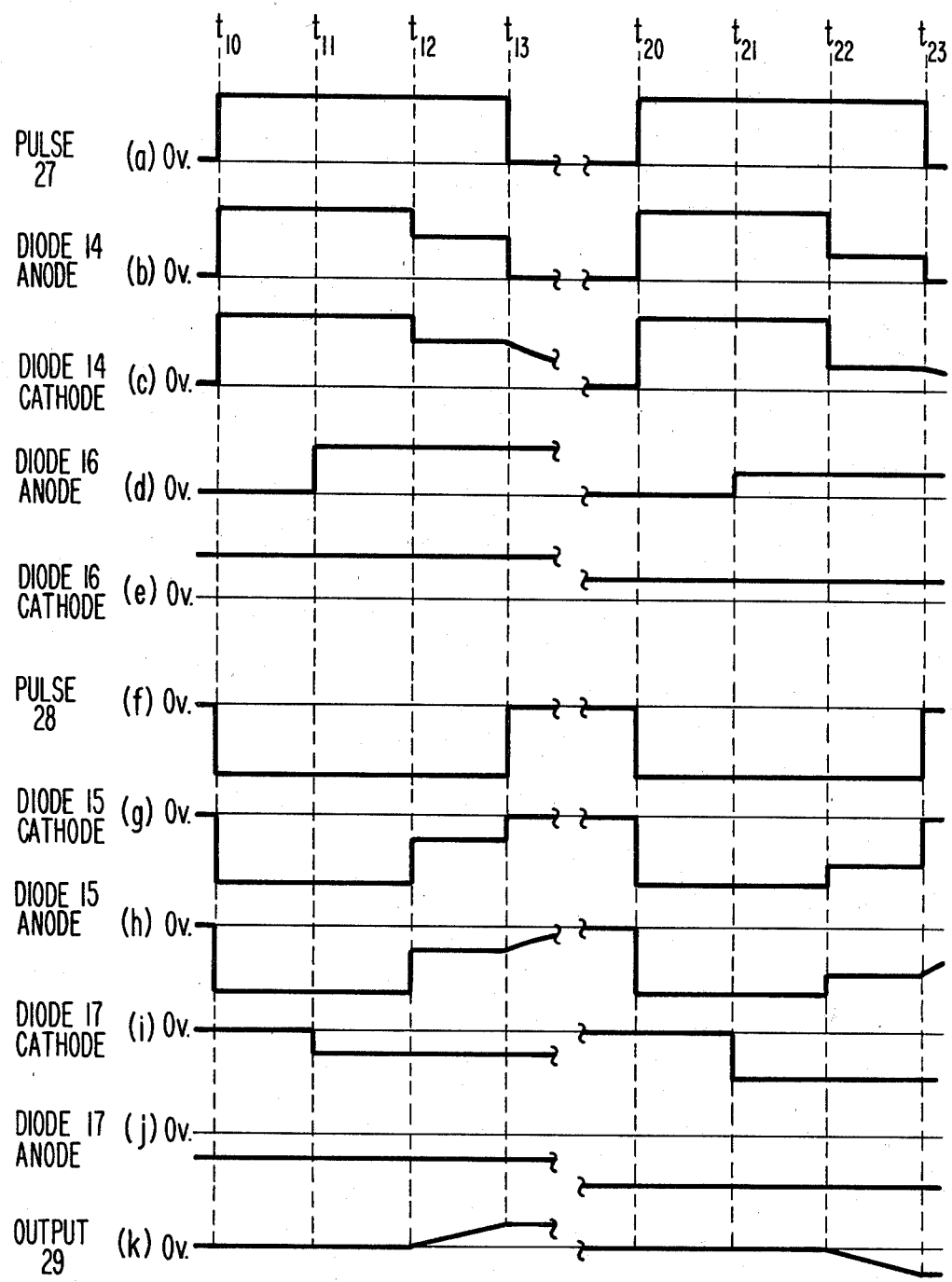
FIG. 3 is a set of timing diagrams useful in explaining the operation of the circuit of FIG. 2.

FIG. 3 is a set of timing diagrams which facilitate an understanding of the operation of the present invention. Each of the timing diagrams 3(a) through 3(k), represents the voltage at the indicated node during an interval of time associated with the occurrence of pulses 27 and 28. It should be noted that pulses 27 and 28 beginning at time $t_{10}$ and ending at time $t_{13}$ are associated with a positive instantaneous amplitude of the RF signal, while the pulses 27 and 28 between times $t_{20}$ and $t_{23}$ are associated with a negative instantaneous amplitude of the RF signal. The demarcations on the time axis (horizontal axis) are not meant to be scaled in any relative manner; similarly, the levels on the voltage axes (vertical axes) are unscaled and the magnitudes serve only to distinguish voltage changes and do not imply relative amplitudes. Finally, it should be noted that the voltages at output 29 are very small in relation to the pulse voltages, and the voltage changes in FIG. 3(k) are highly exaggerated in relation to the other timing diagrams.

The occurrences at time $t_{10}$ of pulses 27 and 28, FIG. 3(a) and FIG. 3(f) respectively, drive diodes 14 and 15 into conduction, and that event is shown at time $t_{10}$ in FIGS. 3(b), (c), (g) and (h). No attempt is made in these timing diagrams to represent the voltage drops across the diodes which, for the devices selected, is in the order of 0.4 to 0.5 volts. The interval between $t_{10}$ and $t_{11}$ represents the propagation delay time along conductors 18 and 19.

At $t_{11}$ the pulse wavefronts reach diodes 16 and 17. At this time, the instantaneous amplitude of the RF signal is some positive voltage, and this is reflected as a positive shift of the dc bias voltage shown in FIGS. 3(e) and (j), during times $t_{10}$ through $t_{13}$, as an imbalance in the positive direction. The pulse wavefronts cause conduction of diodes 16 and 17 and new wavefronts, shown in FIGS. 3(d) and (i) as equal to the bias voltage with the positive shift, begin to propagate back along conductors 18 and 19.

At $t_{12}$ the return wavefronts reach diodes 14 and 15 as shown in FIGS. 3(b), (c), (g) and (h). The imbalance causes a net positive voltage at output terminal 29 and the capacitor 21 at that terminal begins to charge, as shown in FIG. 3(k). The period from $t_{12}$ to $t_{13}$ represents a very small fraction of the RC time constant of resistor 20 and capacitor 21, so the charge rate is virtually linear during this time. At $t_{13}$ pulses 27 and 28 terminate, as shown in FIGS. 3(a) and (f), the voltages at the anode of diode 14 (FIG. 3(b)) and the cathode of diode 15 (FIG. 3(g)) drop to essentially zero, the voltages on conductors 18 and 19 (FIGS. 3(c) and (k), respectively) dissipate through resistors 37 and 38, respectively, and the charge stored at output terminal 29 (FIG. 3(k)) dissipates slowly through resistor 20.

After a period of time, represented in FIG. 3 as the time axis interruptions, the circuit reaches a steady state condition, ready for another pulse at time $t_{20}$. The balance of the timing diagrams of FIG. 3, from time $t_{20}$ through $t_{23}$, represents the circuit response to pulses 27 and 28 (FIGS. 3(a) and (f)) when the RF signal assumes a negative value, shifting the dc bias voltages at the cathode of diode 16 and the anode of diode 17 in a negative direction, as shown by the imbalance of the voltages in FIGS. 3(e) and (j) from $t_{20}$ through $t_{23}$.

The high-speed sampling head circuit, as shown in FIG. 2, has been constructed using the following component values:

| | |
|---|---|
| Resistor 20 | 100K ohm |
| Resistor 32 | 50 ohm |
| Resistors 35 and 36 | 5.11K ohm |
| Resistors 37 and 38 | 2.7K ohm |
| Resistor 42 | 75 ohm |
| Capacitors 39, 40 and 41 | 1,000 picofarad. |

Capacitor 21, although a parasitic inherent to the circuit, has been measured as 20 picofarads. $I_B$ has been selected to be approximately two milliamperes, resulting in a bias voltage across each resistor 35 and 36 of about one volt.

Using the above values, and an input pulse width of approximately 700 picoseconds, which is widened to a trapezoidally-shaped pulse of approximately 900 picoseconds at the base by the spreading inductance of the transformer 13 and additionally by its parasitic capacitance, the applicant has achieved an effective sampling pulse, using the pulse-shortening technique described above, of approximately 600 picoseconds. As a result, this circuit may be used to sample RF signals in the frequency range of 100–500 MHz, with a sampling rate of 50 kHz.

Throughout this description conductors 18 and 19 have been shown as a single transmission line. In practice, however, when this circuit is disposed on a circuit board, it may be more practical to implement each conductor 18 and 19 as the first conductors of two matched transmission lines, where the second conductors, which would likely be located on the opposite side of the board, are connected to ground.

What is claimed is:

1. An apparatus for sampling the instantaneous level of a radio frequency (RF) signal conducted by a transmission line, said apparatus comprising:
   source means for providing an input signal having a pulse of predetermined width;
   means coupled to said source means for transforming said input signal into two balanced signals;
   a pair of conductors coupled at their first ends to said transforming means to conduct said balanced signals, respectively, in forward and reverse directions at a predetermined velocity;
   first and second diodes individually coupled at their first ends to the second ends of said pair of conductors, said first and second diodes configured to conduct forward current in conformity with said balanced signals;
   first and second resistors coupled at their first ends to the second ends of said first and second diodes, respectively, said first and second resistors coupled at their second ends to said transmission line conducting said RF signal;
   means for coupling a source of constant current to said first and second resistors to thereby provide constant biasing potentials at said first and second diodes referenced to the instantaneous amplitude of said RF signal;
   means coupled to said transforming means for sensing the signals on said pair of conductors and thereby provide a measure of the instantaneous amplitude of said RF signal; and
   means for blocking the signal on said pair of conductors from said sensing means in the absence of said input signal.

2. The apparatus according to claim 1 wherein said transforming means provides dc isolation between said transmission line conducting said RF signal and said source means.

3. The apparatus according to claim 1 further including capacitors connected in parallel with each of said first and second resistors to thereby maintain said constant biasing potential at said first and second diodes in the presence of said balanced signals.

4. The apparatus according to claim 1 further including first and second impedances coupled respectively between said pair of conductors and a source of ground potential to provide a means for discharging said pair of conductors.

5. The apparatus according to claim 1 wherein said blocking means includes third and fourth diodes coupled respectively between said transforming means and said pair of conductors and configured to conduct forward current in conformity with said balanced signals.

6. The apparatus according to claim 1 wherein said sensing means includes a capacitance coupled between a source of ground potential and said transforming means at a point where the current supplied to charge said capacitance represents the vector sum of the currents in said pair of conductors; and
   a third resistor connected across said capacitance for discharging said capacitance in the absence of charging current.

7. The apparatus according to claim 1 wherein said pair of conductors comprise a length of transmission line.

8. The apparatus according to claim 1 wherein each of said pair of conductors comprises the first conductor of a pair of matched transmission lines, each of said transmission lines having its second conductor coupled to ground potential.

9. The apparatus according to claim 6 wherein said third resistor includes a first parasitic capacitance to ground, said transforming means includes a second parasitic capacitance to ground, and wherein said capacitance of said sensing means is the combination of said first and second parasitic capacitances.

* * * * *